(12) United States Patent
Guha et al.

(10) Patent No.: US 9,496,140 B2
(45) Date of Patent: Nov. 15, 2016

(54) SILICON WAFER BASED STRUCTURE FOR HETEROSTRUCTURE SOLAR CELLS

(75) Inventors: Supratik Guha, Chappaqua, NY (US); Harold J. Hovel, Katonah, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 566 days.

(21) Appl. No.: 13/372,974

(22) Filed: Feb. 14, 2012

(65) Prior Publication Data
US 2012/0138132 A1 Jun. 7, 2012

Related U.S. Application Data

(62) Division of application No. 12/553,453, filed on Jul. 31, 2009, now Pat. No. 8,119,904.

(51) Int. Cl.
| | |
|---|---|
| *H01L 21/02* | (2006.01) |
| *H01L 31/0687* | (2012.01) |
| *H01L 31/18* | (2006.01) |
| H01L 31/0304 | (2006.01) |
| H01L 31/0693 | (2012.01) |

(52) U.S. Cl.
CPC ..... *H01L 21/02642* (2013.01); *H01L 21/0245* (2013.01); *H01L 21/0251* (2013.01); *H01L 21/02381* (2013.01); *H01L 21/02532* (2013.01); *H01L 21/02647* (2013.01); *H01L 31/0687* (2013.01); *H01L 31/1852* (2013.01); *H01L 31/1872* (2013.01); *H01L 31/1892* (2013.01); *H01L 21/02667* (2013.01); *Y02E 10/544* (2013.01); *Y02P 70/521* (2015.11)

(58) Field of Classification Search
CPC ................. H01L 21/02647; H01L 31/03046; H01L 31/0693
See application file for complete search history.

(56) References Cited

U.S. PATENT DOCUMENTS

| | | | |
|---|---|---|---|
| 4,094,704 A | 6/1978 | Milnes | |
| 4,370,510 A * | 1/1983 | Stirn | ............................ 136/262 |
| 4,392,297 A | 7/1983 | Little | |
| 4,486,265 A | 12/1984 | Little | |

(Continued)

FOREIGN PATENT DOCUMENTS

| | | |
|---|---|---|
| CN | 101241945 | 8/2008 |
| CN | 101483202 | 7/2009 |

(Continued)

OTHER PUBLICATIONS

Langdo, T.A., et al., "High Quality Ge on Si by Epitaxial Necking," Applied Physics Letters, AIP, American Institute of Physics, Melville, NY, US, vol. 76, No, 25, Jun. 19, 2000, pp. 3700-3702, XP012025569, ISSN: 0003-6951, DOI: 10.1063/1.126754.

(Continued)

*Primary Examiner* — Magali P Slawski

(57) ABSTRACT

A multi-junction photovoltaic device includes a silicon substrate and a dielectric layer formed on the silicon substrate. A germanium layer is formed on the dielectric layer. The germanium includes a crystalline structure that is substantially similar to the crystalline structure of the silicon substrate. A first photovoltaic sub-cell includes a first plurality of doped semiconductor layers formed on the germanium layer. At least a second photovoltaic sub-cell includes a second plurality of doped semiconductor layers formed on the first photovoltaic sub-cell that is on the germanium layer that is on the dielectric layer.

10 Claims, 4 Drawing Sheets

(56) References Cited

U.S. PATENT DOCUMENTS

| | | | | |
|---|---|---|---|---|
| 4,667,059 | A | 5/1987 | Olson | 136/249 |
| 5,131,954 | A | 7/1992 | Vogeli et al. | |
| 5,866,471 | A | 2/1999 | Beppu et al. | |
| 6,331,670 | B2 | 12/2001 | Takehara et al. | 136/244 |
| 7,732,706 | B1* | 6/2010 | Mardesich | 136/261 |
| 2001/0018924 | A1* | 9/2001 | Hisamatsu et al. | 136/249 |
| 2002/0019054 | A1* | 2/2002 | Puskas et al. | 436/37 |
| 2003/0168654 | A1 | 9/2003 | Cheng et al. | |
| 2004/0082098 | A1* | 4/2004 | Schmid | 438/99 |
| 2004/0200520 | A1 | 10/2004 | Mulligan et al. | |
| 2006/0071213 | A1 | 4/2006 | Ma et al. | 257/65 |
| 2006/0073681 | A1* | 4/2006 | Han | 438/479 |
| 2006/0144435 | A1* | 7/2006 | Wanlass | 136/249 |
| 2007/0267722 | A1* | 11/2007 | Lochtefeld et al. | 257/618 |
| 2007/0277874 | A1 | 12/2007 | Dawson-Elli et al. | 136/256 |
| 2008/0153267 | A1 | 6/2008 | Clavelier et al. | |
| 2010/0294352 | A1* | 11/2010 | Srinivasan et al. | 136/256 |
| 2011/0284054 | A1* | 11/2011 | Wanlass | 136/246 |
| 2012/0319167 | A1* | 12/2012 | van Dal et al. | 257/192 |
| 2014/0264459 | A1* | 9/2014 | Choi et al. | 257/201 |

FOREIGN PATENT DOCUMENTS

| | | |
|---|---|---|
| EP | 1936669 | 6/2008 |
| EP | 2012367 | 1/2009 |
| JP | 57-007166 | 1/1982 |
| JP | 02-177371 | 7/1990 |
| JP | 03-101274 | 4/1991 |

OTHER PUBLICATIONS

International Search Report and Written Opinion dated May 2, 2011 for PCT/EP2010/059058.

Liu et al. "High-quality single-crystal Ge on insulator by liquid-phase epitaxy on Si substrates." Applied Physics Letters, Apr. 5, 2004, vol. 84, No. 14, 2563-2565.

Li, Q., et al., "Selective growth of Ge on Si(100) through vias of SiO2 nanotemplate using solid source molecular beam epitaxy" Applied Physics Letters, Dec. 15, 2003, p. 5032-5034, vol. 83, No. 24. DOI: 10.1063/1.1632037. Copyright 2003 American Institute of Physics.

* cited by examiner

SILICON WAFER BASED STRUCTURE FOR HETEROSTRUCTURE SOLAR CELLS

CROSS-REFERENCE TO RELATED APPLICATIONS

This is a divisional of and claims priority from U.S. patent application Ser. No. 12/533,453, filed on Jul. 31, 2009, now U.S. Pat. No. 8,119,904, the entire disclosure of which is hereby incorporated by reference in its entirety.

FIELD OF THE INVENTION

The present invention generally relates to the field of solar cells, and more particularly relates to silicon wafer based structures for multi-junction solar cells.

BACKGROUND OF THE INVENTION

Photovoltaic structures found in solar cells are semiconductor structures that convert photons into electricity. In general a photovoltaic cell performs photo-generation of charge carriers (electrons and holes) in a light-absorbing material and separates the charge carriers to a conductive contact that will transmit the electricity. The conversion process of a photovoltaic cell is referred to as photovoltaic effect. The photovoltaic effect allows a solar cell to create solar energy.

One type of photovoltaic cell is a multi-junction cell such as a triple-junction solar cell. Conventional triple-junction solar cells consist of GaInP and GaAs subcells on a p-type Ge substrate. A third subcell is formed by the near-surface doping of the Ge substrate with As to form an n-p junction. The device structure consists of GaInP, GaAs, and Ge subcells separated by heavily-doped tunnel-junctions to enable efficient electrical contact between the cells. Germanium compound semiconductor based triple junction cells currently provide the highest efficiencies for solar cells and are potentially applicable to the optical concentrator market. However, using germanium as a wafer for multi-junction solar cells has drawbacks such as the resulting weight of the final device. Also, germanium is an expensive material and a non-plentiful material.

Therefore a need exists to overcome the problems with the prior art as discussed above.

SUMMARY OF THE INVENTION

In one embodiment, a multi-junction photovoltaic device is disclosed. The multi-junction photovoltaic device includes a silicon substrate and a dielectric layer formed on the silicon substrate. A germanium layer is formed on the dielectric layer. The germanium includes a crystalline structure that is substantially similar to the crystalline structure of the silicon substrate. A first photovoltaic sub-cell includes a first plurality of doped semiconductor layers, formed on the germanium layer that is on the dielectric layer. At least a second photovoltaic sub-cell includes a second plurality of doped semiconductor layers, formed on first photovoltaic sub-cell that is on the germanium layer that is on the dielectric layer. One advantage of the various embodiments of the present invention is that silicon can be used as the substrate for multi-junction photovoltaic cells.

In another embodiment, another multi-junction photovoltaic device is disclosed. The multi-junction photovoltaic device includes a silicon substrate and a dielectric layer formed on the silicon substrate. A metal reflective layer is formed between the silicon substrate and the dielectric layer. A germanium layer is formed on the dielectric layer. The germanium comprises a crystalline structure that is substantially similar to the crystalline structure of the silicon substrate. A silicon-germanium graded buffer layer is formed between the dielectric layer and the germanium layer. A first photovoltaic sub-cell comprising a first plurality of doped semiconductor layers is formed on the germanium layer that is on the dielectric layer. At least a second photovoltaic sub-cell comprising a second plurality of doped semiconductor layers is formed on the first multi-junction photovoltaic cell that is on the germanium layer that is on the dielectric layer. The second photovoltaic sub-cell is electrically coupled to the first photovoltaic sub-cell via a tunneling n+p+ diode. A sub-cell may also be formed in the germanium layer by incorporating n-type doping on the surface of the p-type germanium. This "bottom" cell is coupled to the first sub-cell above it by a tunneling p/n junction.

In yet another embodiment, a method for fabricating a multi-junction photovoltaic device is disclosed. The method includes forming a dielectric layer on a silicon substrate. Channels within the dielectric layer are formed. The channels extend through the dielectric layer exposing an upper portion of the silicon substrate. A layer of germanium is deposited on the dielectric layer. The germanium layer extends in the channels. Since the dielectric layer is amorphous as deposited on the Si substrate, the germanium layer is also amorphous as deposited. The amorphous germanium layer is allowed to re-crystallize such that the crystalline orientation of the silicon substrate acts as a re-crystallization template for the amorphous germanium. A first photovoltaic sub-cell comprising a first plurality of doped semiconductor layers is formed on the germanium layer which has been recrystallized. At least a second photovoltaic sub-cell comprising a second plurality of doped semiconductor layers is formed on the first photovoltaic sub-cell that is on the germanium layer that is on the dielectric layer.

In another embodiment, an integrated circuit is disclosed. The integrated circuit includes a circuit supporting substrate comprising an electrical contact and a multi-junction photovoltaic device electrically coupled to the electrical contact. The multi-junction photovoltaic device includes a silicon substrate and a dielectric layer formed on the silicon substrate. A germanium layer is formed on the dielectric layer. The germanium includes a crystalline structure that is substantially similar to the crystalline structure of the silicon substrate. A first photovoltaic sub-cell includes a first plurality of doped semiconductor layers, formed on the germanium layer that is on the dielectric layer. At least a second photovoltaic sub-cell includes a second plurality of doped semiconductor layers, formed on first photovoltaic sub-cell that is on the germanium layer that is on the dielectric layer, electrically coupled to the first multi-junction photovoltaic cell via a tunneling n+p+ diode. One advantage of the various embodiments of the present invention is that silicon can be used as the substrate for multi-junction photovoltaic cells.

As discussed above, germanium is generally used as the substrate material in conventional multi-junction solar cells, but is expensive and not very plentiful. The various embodiments of the present reduce this cost by using silicon as the substrate material. A dielectric, which can be conducting or insulating, is then formed upon the silicon substrate followed by growth and crystallization of germanium on the dielectric layer. The germanium acts as a base for depositing the multi-junction devices thereon. The dielectric layer separates the semiconductor layers of sub-cells from the silicon substrate. The recrystallization of the germanium mitigates defects experienced as a result of the silicon lattices and the semiconductors for the multi-junction cells not matching. For example, the recrystallization process creates low defect density substrates that are lattice matched to the compound semiconductor layers which comprise the multi-junction cells.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure and function. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Figure 1:
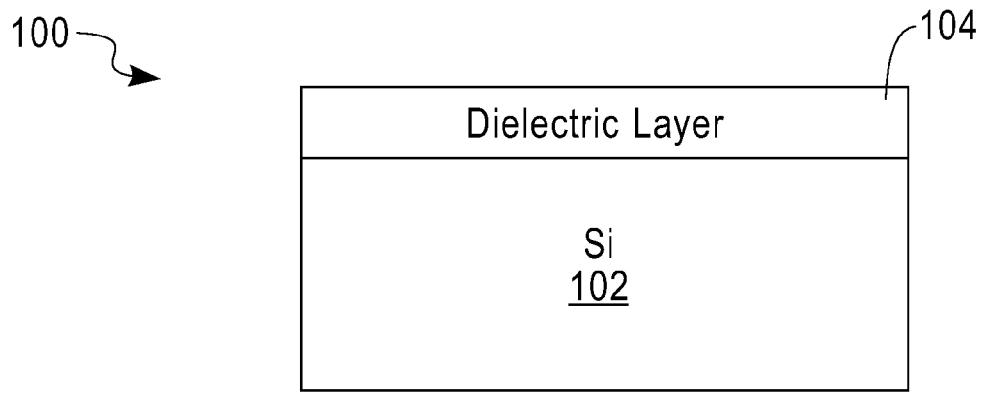
FIGS. 1-7 are cross-sectional views of various layers of a multi-junction photovoltaic cell and fabrication process thereof according to one embodiment of the present invention.

FIGS. 1 to 7 illustrate a heterostructure solar cell implementing a silicon (Si) substrate. In particular, the following discussion describes a device structure that comprises a germanium/amorphous layer/silicon wafer upon which a compound semiconductor heterostructure is grown. The device acts as a photovoltaic cell. FIG. 1 shows a wafer 100 comprising a crystalline silicon substrate 102, which can be a single-crystalline or multi-crystalline silicon, having an amorphous dielectric layer 104 formed thereon. The dielectric layer 104, in one embodiment, is either conducting or insulating. Examples of conducting material that can be grown on the silicon substrate 102 are Tantalum Silicon Nitride (TaSiN), Iridium-Rhenium (Ir—Re), Iridium-Tantalum (Ir—Ta), Rhenium-Tantalum (Re—Ta), and the like. Examples of insulating material that can be grown on the silicon substrate 102 are Silicon Dioxide ($SiO_2$), Silicon Nitride (SiN), Titanium Oxide ($TiO_2$), and the like. These materials can be formed on the silicon substrate 102 using any conventional deposition process such metal-organic chemical vapor deposition ("MOCVD") or atomic-layer deposition ("ALD") and physical vapor deposition ("PVD").

Figure 2:
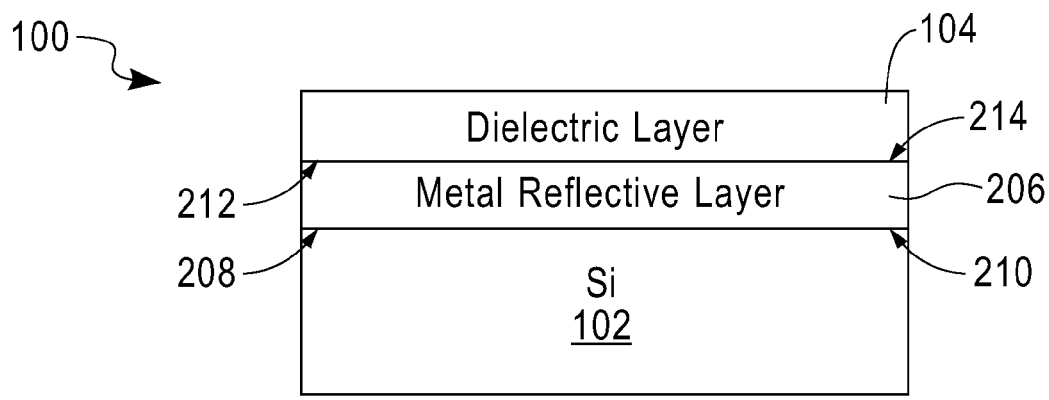

In one embodiment, an optional metal reflective layer 206 is deposited between the silicon substrate 102 and the dielectric layer 104, as shown in FIG. 2. For example, a bottom portion 208 of the metal reflective layer 206 is formed on an upper portion 210 of the silicon substrate 102 and a bottom portion 212 of the dielectric layer 104 is formed on an upper portion 214 of the metal reflective layer 206. The metal reflective layer 206 increases the amount of light being coupled into the photovoltaic cell. The metal reflective layer 206 can be comprised of metal materials such as (but not limited to) chromium or aluminum and can be deposited using a deposition process such as (but not limited to) sputtering, evaporation, chemical vapor deposition, and plasma-enhanced chemical vapor deposition ("PECVD"). The optional metal reflective layer 206 allows thinner semiconductor layers to be used as a result of added light trapping. Layer thicknesses can be, for example, 0.5-0.75 microns as compared to 1.5-2.0 microns thick.

Figure 3:
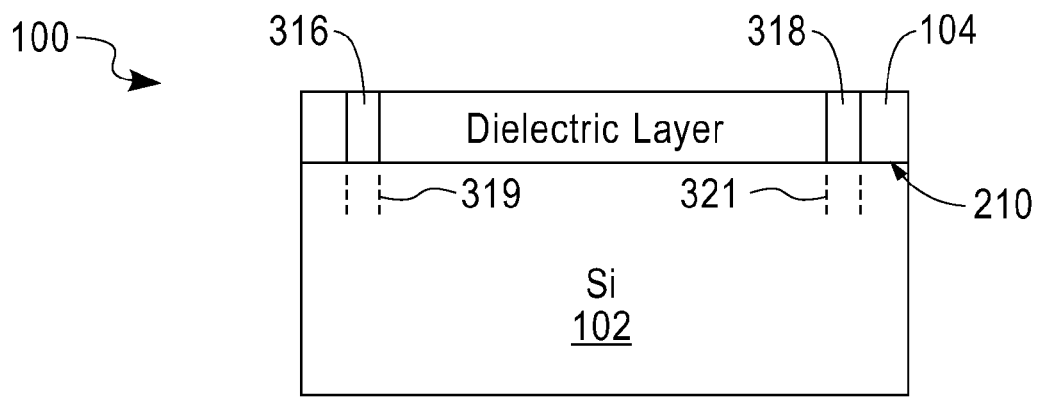
Figure 4:
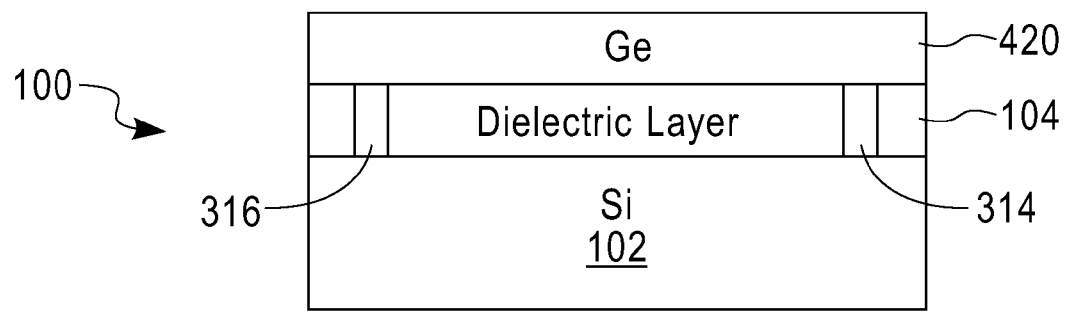

Once the dielectric layer 104 is formed, channels 316, 318 are creating within the amorphous layer 104 using lithograph and etching processes, as shown in FIG. 3. It should be noted that FIG. 3 shows two channels 316, 318 for illustration purposes only, as more channels can be formed as necessary. The channels 316, 318 act as seeding windows and extend through the dielectric layer 104 down to the silicon substrate 102 exposing the upper portion 210 of the silicon substrate 102. In one embodiment, the channels 316, 318 extend down into the silicon substrate 102 as shown by the dashed lines 319, 321. If a reflective metal layer is present between the silicon and dielectric layer, the openings 316 and 318 extend through both the dielectric and the metal layer down to the Si surface 210.

An amorphous germanium (Ge) layer 420 is then formed on the dielectric layer 104 using well known deposition processes. For example, Ge can be non-selectively sputtered onto the dielectric layer 104 and the areas of the Si substrate 102 exposed by the channels 316, 318. An annealing process is then performed causing the Ge to melt while the Si layer 102 remains solid. The wafer 100 is then cooled where an epitaxial growth process occurs. During the epitaxial process, Ge growth begins from the Si/Ge interface in the channels 316, 318 and propagates laterally through Ge liquid situated on the dielectric layer 104, thereby forming a recrystallized Ge layer 420 comprising a single-crystalline structure. A more detailed discussion of one applicable epitaxial process is given in Liu et al., "High-quality single-crystal Ge on insulator by liquid-phase epitaxy on Si substrates", Applied Physics Letters, Vol. 84, No. 14, Apr. 5, 2004, which is hereby incorporated by reference in its entirety. It should be noted that the liquid-phase epitaxy process discussed in this publication is only one example of a process for recrystallizing Ge on Si that is applicable to one or more embodiments of the present invention.

Figure 5:
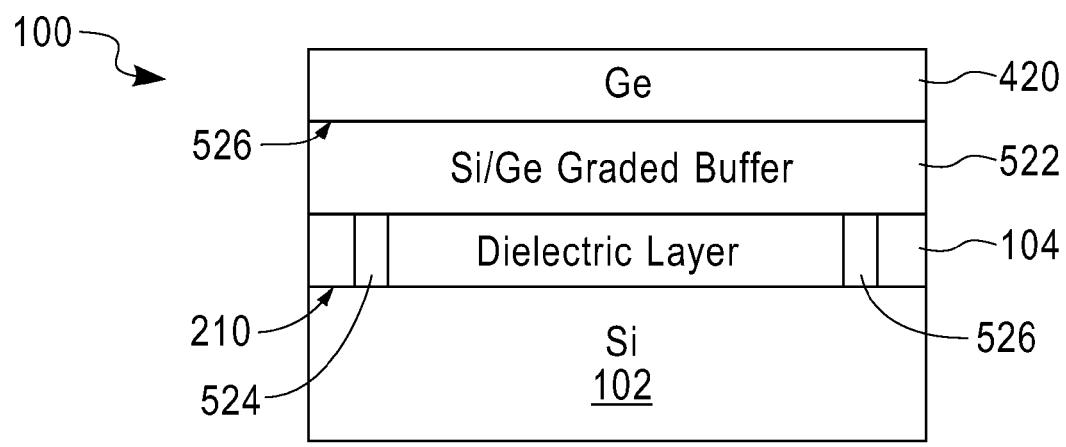

Silicon and germanium generally do not have a good lattice match since the lattice of Ge is larger than the lattice of Si. Combining Si and Ge creates strain on the structure causing defects such as dislocations. However, these defects can be avoided by using a graded buffer layer 522 as shown in FIG. 5. Lithography and etching process are used to create vias 524, 526 in the dielectric layer 104 prior to depositing the Ge layer 420 thereby exposing an upper portion 210 of the Si layer 102. An epitaxial growth process can be used to grow SiGe up from the Si substrate layer 102 through the vias with a composition of Ge that is determined by the mixture of Si-containing and Ge-containing deposition sources. The Si/Ge composition is graded up and after a given amount of Si/Ge is deposited pure Ge is deposited which then transitions into the Ge layer 420. This graded buffer layer 522 of Si/Ge helps minimize or eliminated defects caused by the Si—Ge lattice mismatch.

Figure 6:
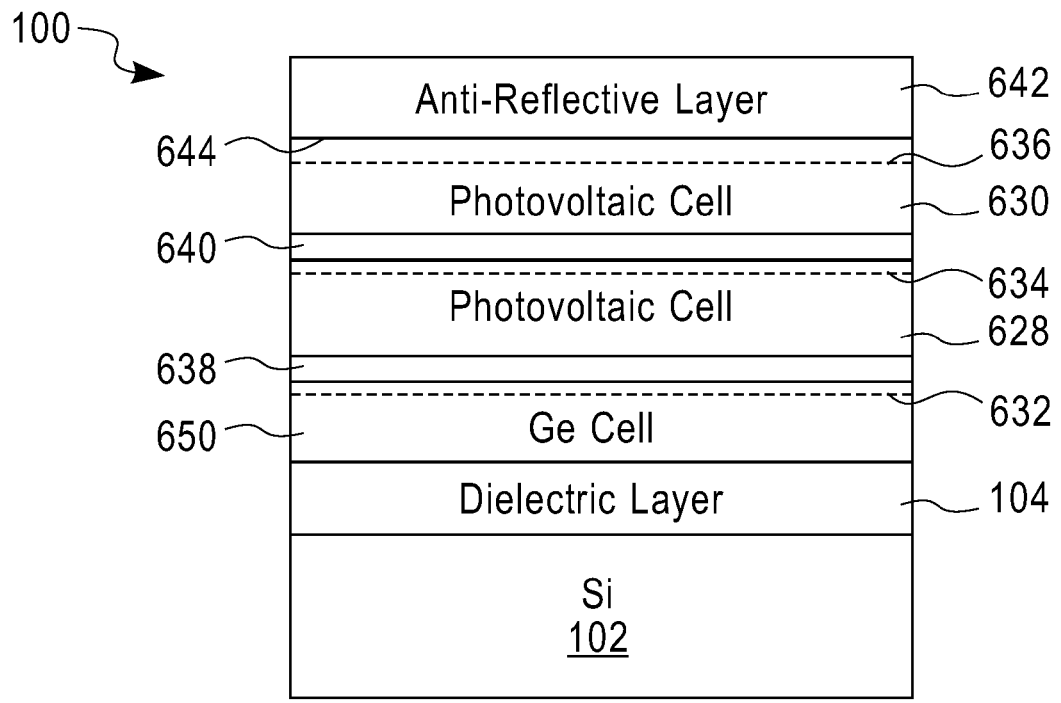

Once the wafer comprising the recrystallized Ge layer 420 is formed, photovoltaic sub-cell structures 628, 630 can then be formed on this wafer 100, as shown in FIG. 6, using conventional fabrication processes such as (but not limited to) Molecular Beam Epitaxy ("MBE"), CVD, MOCVD. It should be noted that in addition to forming the photovoltaic cell structures 628, 630 directly on a wafer 100 comprising the Si substrate 102, dielectric layer 104, and the Ge layer 420, the cells 628, 630 can be formed on a sacrificial substrate containing a layer of Ge. The multi-junction structure consisting of the cells formed on the Ge on the sacrificial substrate can then be transferred to a wafer comprising only Si layer 102 and the dielectric layer 104 using a layer transfer process and/or a wafer bonding process.

The multi-junction photovoltaic cells 628, 630, in one embodiment, are III-V devices. In other words, the photovoltaic sub-cells 628, 630 comprise materials from Group III and Group V of the periodic table. For example, the photovoltaic sub-cells 628, 630 may include multiple thin films that are formed using MBE or CVD comprising materials such as (but not limited to) Gallium Arsenide (GaAs), Indium Phosphide (InP), Aluminum Indium Phosphide (AlInP), and Gallium Indium Phosphide (GaInP$_2$). The layers of semiconductors in the photovoltaic cells 628, 630 have decreasing bandgaps where top layers absorb higher-energy photons, while transmitting lower-energy photons that can then be absorbed by lower layers of the multijunction structure.

Each photovoltaic sub-cell 628, 630 and the Ge sub-cell 650 formed in Ge layer 420 is a p-n diode and comprises a p-n junction 632, 634, 636 as shown in FIG. 6. Each of the photovoltaic sub-cells 628, 630, and 650 is connected in series with one another via an n$^+$p$^+$ diode 638, 640 referred to as a tunnel junction. The tunnel junctions 638, 640 can be grown in situ during the growth of the various layers of the photovoltaic cells 628, 630. The tunnel junctions 638, 640 comprise very heavily doped regions and act as ohmic contacts between the different materials in the multi-junction structure comprised of sub-cells 628, 630, and 650. The tunnel junctions 638, 640 allow for voltages generated in the multi-junction photovoltaic cells 628, 630 to be added in series. Layers of III-V compounds such as GaAs, InP, AlInP, and GaInP can be deposited, for example, by mixtures of gases such as trimethyl gallium, trimethyl indium, trimethyl aluminum, arsine, and phosphine with the desired gaseous compositions into vapor deposition reactors at temperatures of 600° C. to 800° C., and layers of different compositions are deposited by changes of the gas phase compositions at desired intervals. Other processes for deposition of III-V compounds include molecular beam epitaxy where the materials are evaporated in high vacuum chambers at rates determined to result in the desired compositions, and MO-MBE where molecular beam epitaxy is combined with gas sources such as trimethyl gallium and/or trimethyl indium.

Once the photovoltaic cells 628, 630 have been formed, an anti-reflective layer 642 is formed on an upper portion 644 of the top multi-junction cell 630. The anti-reflective layer 642 can be formed using conventional deposition processes. In one embodiment, the anti-reflective layer 642 comprises titanium dioxide, silicon nitride, silicon oxide, or combinations of these materials. A passivating layer such as Aluminum Gallium Phosphide (AlGaP), Aluminum Indium Phosphide (AlInP), or the like may be used between the anti-reflective layer 642 and the surface 644 of sub-cell 630 to reduce surface recombination losses.

Figure 7:
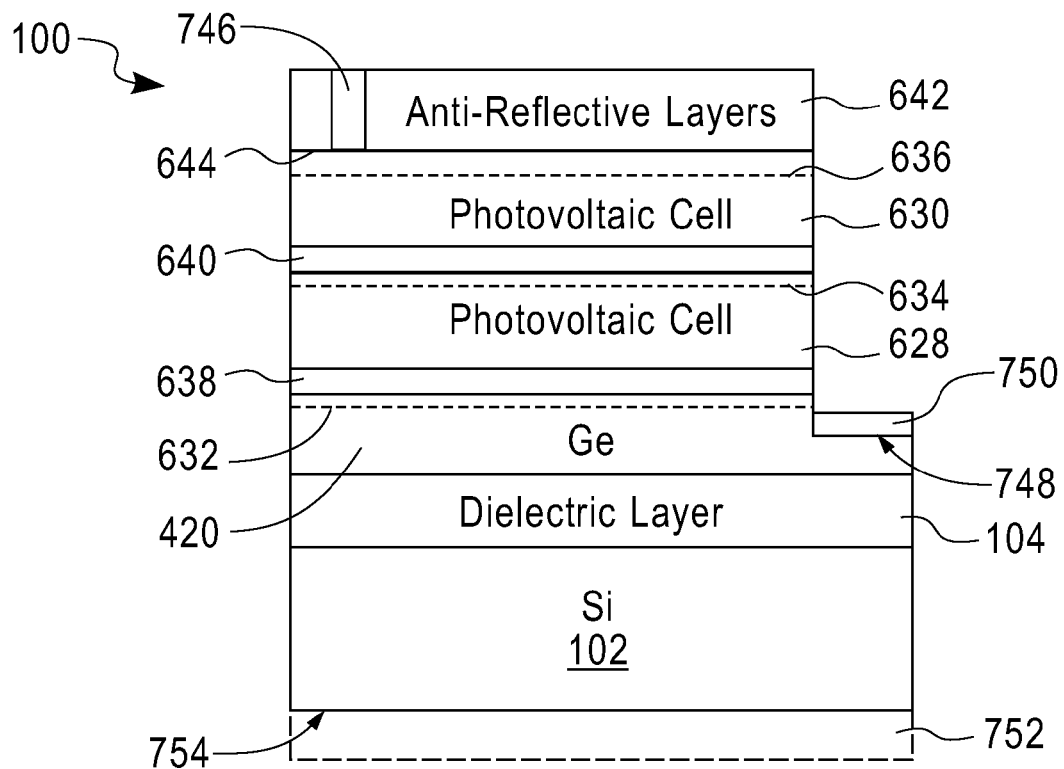

A metallization process can be performed on the wafer 100 to form metal contacts. For example, FIG. 7 shows a top contact 746 formed within the anti-reflective layer 642 that extends down to the upper surface 644 of the p-n junction 636 on the top of photovoltaic sub-cell 630. Photolithography and/or etching can be used to etch away a portion of the anti-reflective layer 642 so that the metal contact can be formed. In an embodiment, where an insulating material is used to form the dielectric layer 104, the anti-reflective layer 642 and, photovoltaic cells 628, 630, are etched back to create an offset region 748 where the dielectric layer 104 and the Si substrate 102 and the Ge layer 420 laterally extend beyond the etched layers. A metal contact 750 can then be formed on the bottom portion of the p-n junction 632 of the Ge layer 420 to make an ohmic contact with the bottom portion of Ge layer 420. However, if the dielectric layer 104 comprises a conductive material and is ohmic to the Si 102 and the Ge 104, the back contact 752 can be formed on a bottom portion 754 of the Si substrate 102. Therefore, in this embodiment, the offset configuration is not required and the device area is increased.

Figure 8:
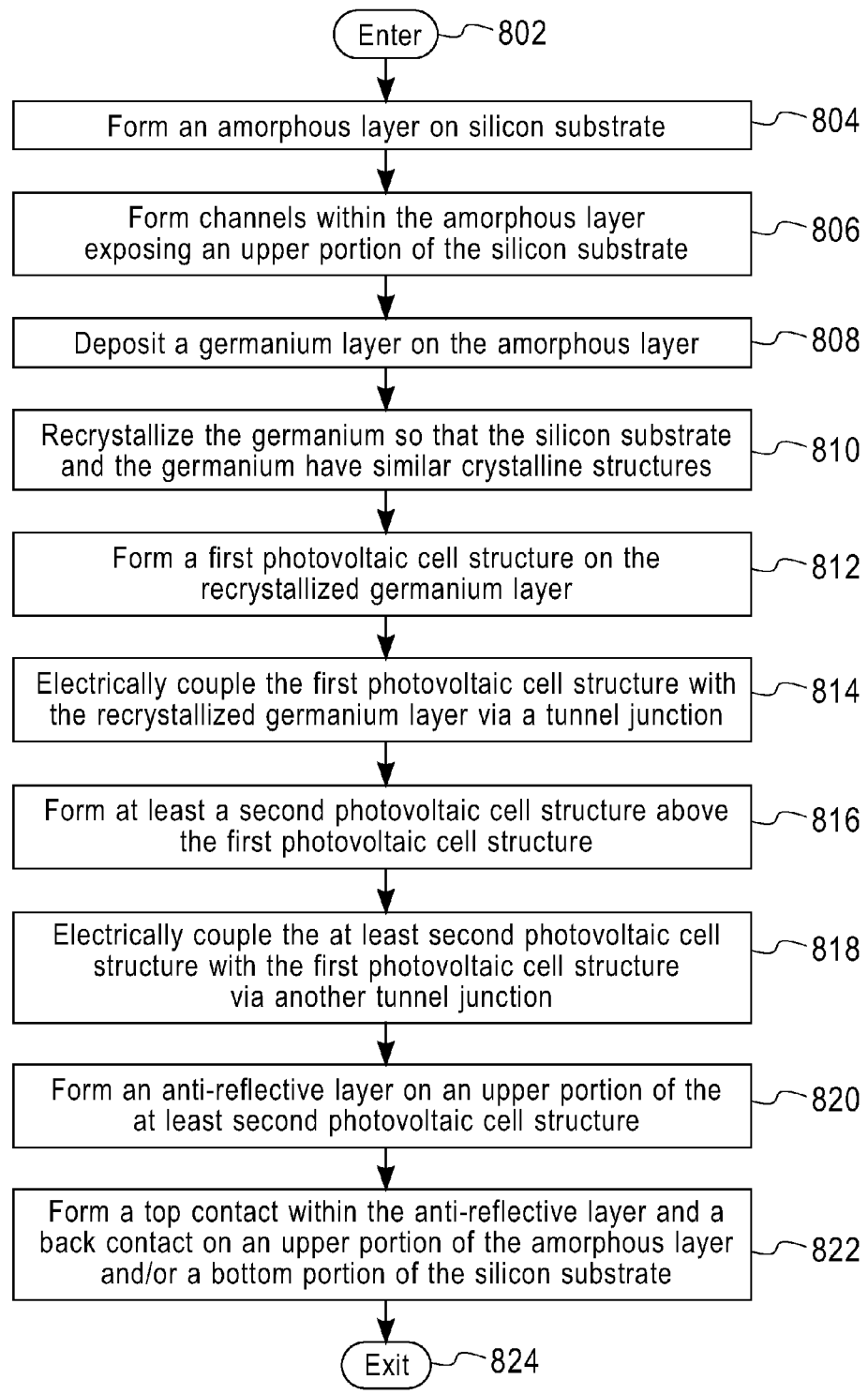
FIG. 8 is an operational flow diagram illustrating one process for fabricating a multi-junction photovoltaic cell according to one embodiment of the present invention.

Many types of metal can be used to form ohmic contacts 750 and 752 to the Ge and/or Si surfaces 748 and 754. For example, Al, Ag, Ti, and combinations such as TiAg deposited by sputtering or evaporation form good ohmic contact to Ge. Al and TiAg also act as good ohmic contacts to Si. For Ge, no contact annealing is necessary, while for Si, heat treatment at 400-500° C. in N$_2$H$_2$ or ArH$_2$ "forming gas" is desirable, in one embodiment, to produce low contact resistances FIG. 8 is an operational flow diagram illustrating one process for fabricating a multi-junction photovoltaic cell. The operational flow diagram of FIG. 8 begins a step 802 and flows directly into step 804. An amorphous dielectric layer 104, which can be either conducting or insulating, at step 804, is formed on a silicon substrate 102. It should be noted that a metal reflective layer 206 can also be formed between the silicon substrate 102 and the dielectric layer 104. Channels 316, 318, at step 806, are formed within the dielectric layer 104 that extend down to the silicon substrate 102. A germanium layer 420, at step 808, is deposited onto the dielectric layer 104. Epitaxial and annealing processes, at step 810, are performed to recrystallize the germanium 420 resulting in the germanium 420 and the silicon 102 having a similar crystalline structure. It should be noted that an Si/Ge graded buffer layer 522 can also be formed between the dielectric layer 104 and the Ge layer 420.

A first photovoltaic sub-cell 628, at step 812, is formed on the germanium layer 420. The first photovoltaic sub-cell 628 and the recrystallized germanium layer 420, at step 814, are electrically coupled via a tunnel junction 638. At least a second photovoltaic sub-cell 630, at step 816, is formed above the first photovoltaic cell 628. The first photovoltaic sub-cell 628 and the at least second photovoltaic sub-cell 630, at step 818, are electrically coupled together via another tunnel junction 640. An anti-reflective layer 642, at step 820, is formed on an upper portion 644 of the at least second photovoltaic sub-cell 630. A top contact 746, at step 822, is formed within the anti-reflective layer 642 and back contact 750/752 is also formed on the back portion of the Ge sub-cell 632 in Ge layer 420 or a bottom portion 754 of the silicon substrate 102. The control flow then exits at step 824.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The multijunction photovoltaic structure as described above can be part of the design for an integrated circuit chip that comprises a circuit supporting substrate including at least one electrical contact electrically coupled to at least one multi-junction photovoltaic device as discussed above. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A multi-junction photovoltaic device comprising:
   a silicon substrate;
   a dielectric layer formed on the silicon substrate, wherein the dielectric layer comprises a plurality of channels extending from below a top surface of the silicon substrate up through the dielectric layer;
   a silicon-germanium layer formed on the dielectric layer, wherein the silicon-germanium layer is a graded buffer layer that extends up from the silicon substrate through the plurality of channels above a top surface of the dielectric layer, and wherein the germanium comprises a crystalline structure that is based on a crystalline structure of the silicon substrate;
   a separate pure germanium layer formed in direct contact with a top surface of the silicon-germanium layer, the pure germanium layer transitioning into the silicon-germanium layer;
   a first photovoltaic sub-cell comprising a first plurality of doped semiconductor layers, formed on the separate pure germanium layer that is on the silicon-germanium layer;
   at least a second photovoltaic sub-cell comprising a second plurality of doped semiconductor layers, formed on the first photovoltaic sub-cell that is on the separate pure germanium layer formed on the silicon-germanium layer;
   an anti-reflective layer formed on an upper portion of the at least second photovoltaic sub-cell;
   a passivation layer formed in between and in contact with a bottom surface of the antireflective layer and a top surface of the at least second photovoltaic sub-cell; and
   a conductive metal layer formed within the anti-reflective layer, wherein the metal conductive layer extends through the anti-reflective layer to the upper portion of the at least second photovoltaic sub-cell.

2. The multi-junction photovoltaic device of claim 1, wherein the dielectric layer is amorphous.

3. The multi-junction photovoltaic device of claim 1, wherein the dielectric layer comprises one of an insulating material and a conductive material.

4. The multi-junction photovoltaic device of claim 1, wherein the first plurality and the second plurality of doped semiconductor layers each include at least one:
   n-type semiconductor layer;
   p-type semiconductor layer; and
   semiconductor junction layer including n-type and p-type doped regions.

5. The multi-junction photovoltaic device of claim 1, further comprising:
   an additional conductive layer formed on and direct contact with a bottom portion of the silicon substrate.

6. The multi-junction photovoltaic device of claim 1, wherein the silicon substrate, a bottom portion of the pure germanium layer, the silicon-germanium layer, and the dielectric layer extend laterally beyond the first photovoltaic sub-cell and the at least second photovoltaic sub-cell thereby creating an offset region.

7. The multi-junction photovoltaic device of claim 6, further comprising:
   a conductive layer formed on the offset region creating an ohmic contact with the pure germanium layer.

8. The multi-junction photovoltaic device of claim 1, further comprising:
   a p-n junction formed within the pure germanium layer; and
   a semiconductor junction layer including n-type and p-type doped regions formed in direct contact with the pure germanium layer, wherein the first photovoltaic sub-cell is in direct contact with the semiconductor junction layer.

9. A multi-junction photovoltaic device comprising:
   a silicon substrate;
   a dielectric layer formed on the silicon substrate;
   a metal reflective layer formed between the silicon substrate and the dielectric layer;

a pure germanium layer formed on the dielectric layer, wherein the germanium comprises a crystalline structure that is based on a crystalline structure of the silicon substrate;

a silicon-germanium graded buffer layer formed between the dielectric layer and the pure germanium layer;

a first photovoltaic sub-cell comprising a first plurality of doped semiconductor layers, formed on the pure germanium layer that is on the dielectric layer, electrically coupled to the pure germanium layer via a first n+p+ diode;

at least a second photovoltaic sub-cell comprising a second plurality of doped semiconductor layers, formed on the first photovoltaic sub-cell that is on the pure germanium layer that is on the dielectric layer, electrically coupled to the first photovoltaic sub-cell via a second n+p+diode, wherein the silicon substrate, a bottom portion of the pure germanium layer, the silicon-germanium layer, and the dielectric layer extend laterally beyond the first photovoltaic sub-cell, the at least second photovoltaic sub-cell, and a remaining portion of the pure germanium layer thereby creating an offset region, an anti-reflective layer formed on an upper portion of the at least second photovoltaic sub-cell;

a passivation layer formed in between and in contact with a bottom surface of the antireflective layer and a top surface of the at least second photovoltaic sub-cell; and a conductive metal layer formed within the anti-reflective layer, wherein the metal conductive layer extends through the anti-reflective layer to the upper portion of the at least second photovoltaic sub-cell.

10. The multi-junction photovoltaic device of claim 9, wherein the dielectric layer comprises one of an insulating material and a conductive material.

* * * * *